United States Patent
Seong

(10) Patent No.: US 8,279,651 B2
(45) Date of Patent: Oct. 2, 2012

(54) MEMORY CHIP PACKAGE WITH EFFICIENT DATA I/O CONTROL

(75) Inventor: Jin Yong Seong, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 206 days.

(21) Appl. No.: 12/826,518

(22) Filed: Jun. 29, 2010

(65) Prior Publication Data

US 2010/0329042 A1 Dec. 30, 2010

(30) Foreign Application Priority Data

Jun. 29, 2009 (KR) .................. 10-2009-0058475

(51) Int. Cl.
*G11C 5/02* (2006.01)
*G11C 7/00* (2006.01)
*G11C 8/00* (2006.01)

(52) U.S. Cl. ....... 365/51; 365/52; 365/189.05; 365/226; 365/230.03; 365/230.06

(58) Field of Classification Search ............ 365/51, 365/52, 189.05, 226, 230.03, 230.06
See application file for complete search history.

(56) References Cited

U.S. PATENT DOCUMENTS

| | | | | |
|---|---|---|---|---|
| 5,625,593 A * | 4/1997 | Kimura | ..................... | 365/189.05 |
| 6,151,257 A * | 11/2000 | Jeffrey et al. | ............ | 365/189.05 |
| 6,311,286 B1 * | 10/2001 | Bertone et al. | .................. | 365/52 |
| 6,366,487 B1 * | 4/2002 | Yeom | ............................... | 365/52 |
| 6,373,753 B1 * | 4/2002 | Proebsting | ............... | 365/230.06 |
| 6,385,073 B1 * | 5/2002 | Yu et al. | ........................... | 365/51 |
| 6,714,452 B2 * | 3/2004 | Kobayashi et al. | ............. | 365/52 |
| 6,813,192 B2 * | 11/2004 | Hwang et al. | ............ | 365/189.05 |
| 7,372,744 B2 * | 5/2008 | Shiga et al. | .............. | 365/189.05 |
| 7,599,205 B2 * | 10/2009 | Rajan | ............................... | 365/51 |
| 7,710,754 B2 * | 5/2010 | Kao | ................................. | 365/51 |
| 7,859,933 B2 * | 12/2010 | Yoshida et al. | .......... | 365/230.03 |

FOREIGN PATENT DOCUMENTS

| | | |
|---|---|---|
| KR | 1020000048169 A | 7/2000 |
| KR | 1020030001964 A | 1/2003 |

* cited by examiner

*Primary Examiner* — Trong Phan

(74) *Attorney, Agent, or Firm* — William Park & Associates Ltd.

(57) ABSTRACT

A memory chip includes a memory circuit unit configured to include memory cells for storing data, a data input and output (I/O) buffer unit configured to include a plurality of data I/O buffer circuits, wherein one of the data I/O buffer circuits is operated by default in order to input and output data to and from the memory chip, a plurality of driver control units configured to generate a plurality of driver addition signals to enable corresponding ones of the data I/O buffer circuits depending on whether a power supply voltage has been received, and a controller configured to generate I/O enable signals for controlling an operation of the data I/O buffer unit.

9 Claims, 5 Drawing Sheets

MEMORY CHIP PACKAGE WITH EFFICIENT DATA I/O CONTROL

CROSS-REFERENCE TO RELATED APPLICATION

Priority to Korean patent application number 10-2009-0058475 filed on Jun. 29, 2009, the entire disclosure of which is incorporated by reference herein, is claimed.

BACKGROUND

The present invention relates generally to a semiconductor memory, and more particularly to a memory chip package with efficient data I/O control.

Size and weight of electronic devices are getting smaller and lighter in line with the technological developments in the semiconductor industry in response to the customer needs. One technique for meeting such needs is the multi-chip packaging technique. The multi-chip packaging technique as implied by the name is a technique for forming a package having a plurality of semiconductor chips within it. Use of a multi-chip package provides advantages in terms of smaller size, lighter weight, and the reduced mounting area as compared to use of several packages each having one semiconductor chip.

The size of a memory cell of a nonvolatile memory device (i.e., a memory chip built in the package), which is implemented to store a large amount of information, is being reduced. With reduction in size of the memory cell, the number of memory cells which are simultaneously programmed through a single program operation is increased. If the number of memory cells that can be simultaneously programmed were to increase and if the number of memory chips that can be simultaneously programmed were also to increase, then these will lead to improvement in the program performance.

A memory chip package includes peripheral circuits for controlling the memory chips and performing a data input and output (I/O). The peripheral circuits can include, for example, a controller coupled to the memory chips and configured to enable the memory chips, issue operation commands, or control the data I/O and an I/O pad circuit for commands or data inputted to and output from the memory chips.

BRIEF SUMMARY

Exemplary embodiments relate to a memory chip package including a plurality of memory chips, wherein the driver capability of an I/O pad circuit can be selectively configured in a wiring process using redundant driver circuits in order to increase the driver capability.

A memory chip according to an aspect of the present disclosure comprises a memory circuit unit configured to include memory cells for storing data, a data I/O buffer unit configured to include a plurality of data I/O buffer circuits, wherein one of the data I/O buffer circuits is operated by default in order to input and output data to and from the memory chip, a plurality of driver control units configured to generate a plurality of driver addition signals to enable corresponding ones of the data I/O buffer circuits depending on whether a power supply voltage has been received, and a controller configured to generate I/O enable signals for controlling the operation of the data I/O buffer unit.

The data I/O buffer unit comprises an output buffer unit comprising a plurality of output buffer circuits, each enabled in response to the output enable signal received through an I/O node wired to an external data I/O package lead and configured to output the data, received from the memory circuit unit, to an I/O pad and an input buffer unit coupled to the I/O pad and configured to include a plurality of input buffer circuits, each enabled in response to the input enable signal and configured to output data, received from the I/O pad, to the memory circuit unit.

Each of the driver control units comprises a buffer configured to determine a logic level of the driver addition signal to determine an operation of a corresponding one of the data I/O buffer circuits, corresponding to a voltage level of a signal received through an input terminal, and configured to output the driver addition signal having a determined logic level through an output terminal and a default setting unit configured to couple the input terminal of the buffer to a ground node so that, in an initial operation, the driver addition signal is fixed to a first logic level. In the case in which the input terminal is wired to the data I/O package lead, the driver addition signal is fixed to a second logic level irrespective of the connection of the default setting unit.

The default setting unit comprises a first transistor turned on by the power supply voltage and a plurality of second transistors turned on by the power supply voltage received through the first transistor. When the second transistors are turned on, the ground node and the input terminal of the buffer are coupled together.

The default setting unit further comprises a first resistor coupled between the first transistor and a terminal through which the power supply voltage is received and a second resistor coupled between the second transistors and the input terminal of the buffer.

A memory chip package according to another aspect of the present disclosure includes one or more memory chips. Each of the memory chips comprises a memory circuit unit configured to include memory cells for storing data, a data I/O buffer unit configured to include a plurality of data I/O buffer circuits, wherein one of the data I/O buffer circuits is operated by default in order to input and output data to and from the memory chip, a plurality of driver control units configured to generate a plurality of driver addition signals to enable corresponding ones of the data I/O buffer circuits depending on whether a power supply voltage has been received, and a controller configured to generate I/O enable signals for controlling an operation of the data I/O buffer unit.

Each of the driver control units comprises a buffer configured to determine a logic level of the driver addition signal to determine the operation of a corresponding one of the data I/O buffer circuits, corresponding to a voltage level of a signal received through an input terminal and configured to output the driver addition signal having a determined logic level through an output terminal and a default setting unit configured to couple the input terminal of the buffer to a ground node so that, in an initial operation, the driver addition signal is fixed to a first logic level. In the case in which the input terminal is wired to the data I/O package lead, the power supply voltage is supplied to the input terminal so that the driver addition signal is fixed to a second logic level irrespective of the connection of the default setting unit.

The default setting unit comprises a first transistor turned on by the power supply voltage and a plurality of second transistors turned on by the power supply voltage received through the first transistor. When the second transistors are turned on, the ground node and the input terminal of the buffer are coupled together.

The default setting unit further comprises a first resistor coupled between the first transistor and a terminal through which the power supply voltage is received and a second resistor coupled between the second transistors and the input terminal of the buffer.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of embodiments of the disclosure.

Figure 1:
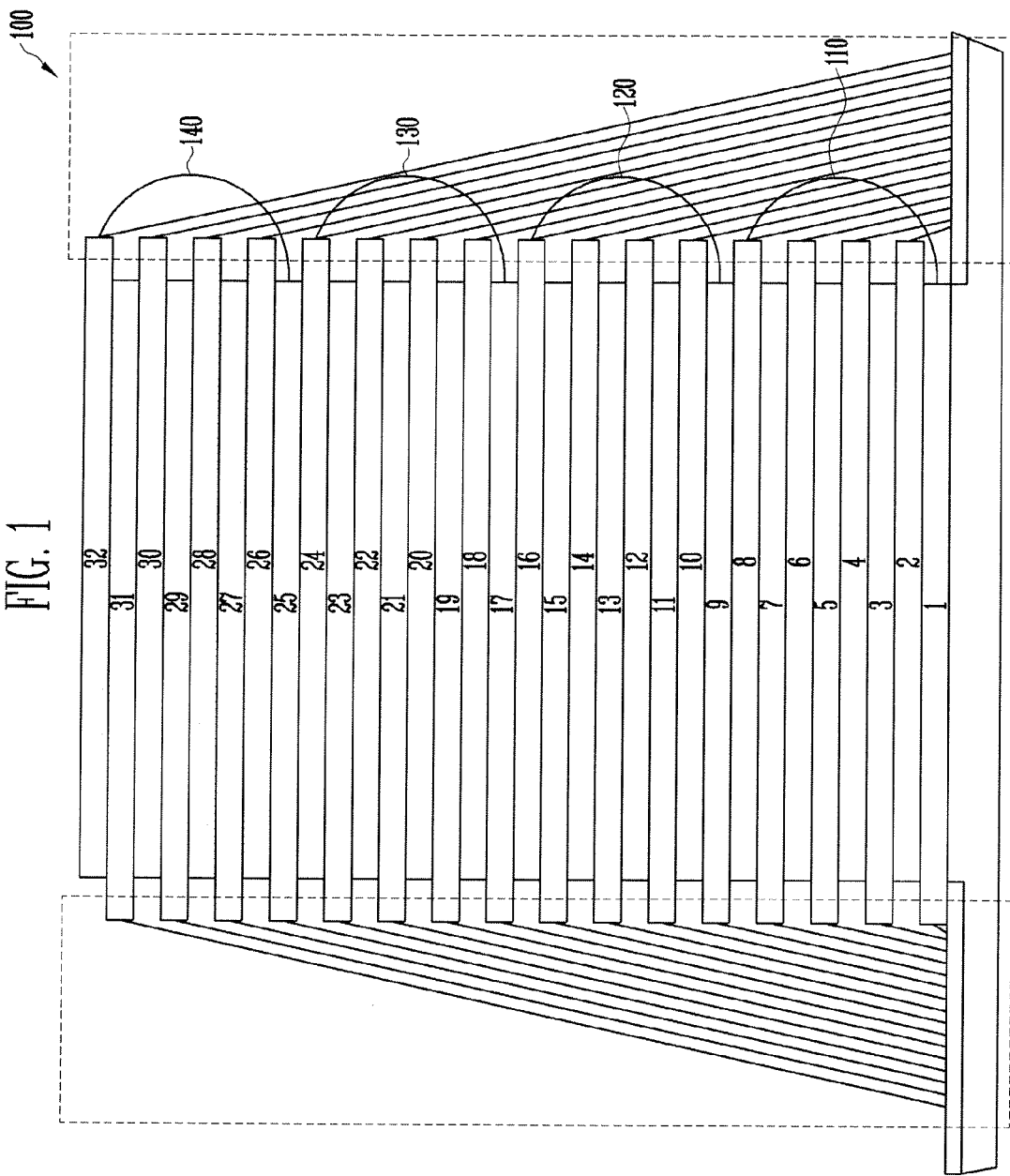
FIG. 1 is a simplified diagram showing a connection between the channels of memory chip groups each including a plurality of memory chips.

FIG. 1 is a simplified diagram showing the connection between the channels of memory chip groups, each chip group including a plurality of memory chips.

Referring to FIG. 1, the channels of first to fourth memory chip groups 110 to 140 are interconnected.

Each of the first to fourth memory chip groups 110 to 140 includes eight memory chips. Accordingly, the memory chip package 100 includes a total of the 32 memory chips.

To select a specific one of the 32 memory chips, a first chip and a second chip are selected depending on the connection of the power supply voltage and the ground voltage, and a specific one of the first and second chips can be selected through the connection of an I/O. This method is illustrated in Table below.

| CHIP | CE # | SELECT FIRST CHIP | SELECT SECOND CHIP | I/O CHANNEL |
|---|---|---|---|---|
| 1 | CE # 1 | Vss | Vss | I/O0 <7:0> |
| 2 |  |  | Vcc |  |
| 3 |  | Vcc | Vss | I/O1 <7:0> |
| 4 |  |  | Vcc |  |
| 5 |  | Vss | Vss | I/O1 <7:0> |
| 6 |  |  | Vcc |  |
| 7 |  | Vcc | Vss | I/O0 <7:0> |
| 8 |  |  | Vcc |  |
| 9 | CE # 2 | Vss | Vss | I/O0 <7:0> |
| 10 |  |  | Vcc |  |
| 11 |  | Vcc | Vss | I/O1 <7:0> |
| 12 |  |  | Vcc |  |
| 13 |  | Vss | Vss | I/O1 <7:0> |
| 14 |  |  | Vcc |  |
| 15 |  | Vcc | Vss | I/O0 <7:0> |
| 16 |  |  | Vcc |  |
| 17 | CE # 3 | Vss | Vss | I/O0 <7:0> |
| 18 |  |  | Vcc |  |
| 19 |  | Vcc | Vss | I/O1 <7:0> |
| 20 |  |  | Vcc |  |
| 21 |  | Vss | Vss | I/O1 <7:0> |
| 22 |  |  | Vcc |  |
| 23 |  | Vcc | Vss | I/O0 <7:0> |
| 24 |  |  | Vcc |  |
| 25 | CE # 4 | Vss | Vss | I/O0 <7:0> |
| 26 |  |  | Vcc |  |
| 27 |  | Vcc | Vss | I/O1 <7:0> |
| 28 |  |  | Vcc |  |
| 29 |  | Vss | Vss | I/O1 <7:0> |
| 30 |  |  | Vcc |  |
| 31 |  | Vcc | Vss | I/O0 <7:0> |
| 32 |  |  | Vcc |  |

The data I/O of the memory chips is performed through an I/O pad circuit.

Figure 2:
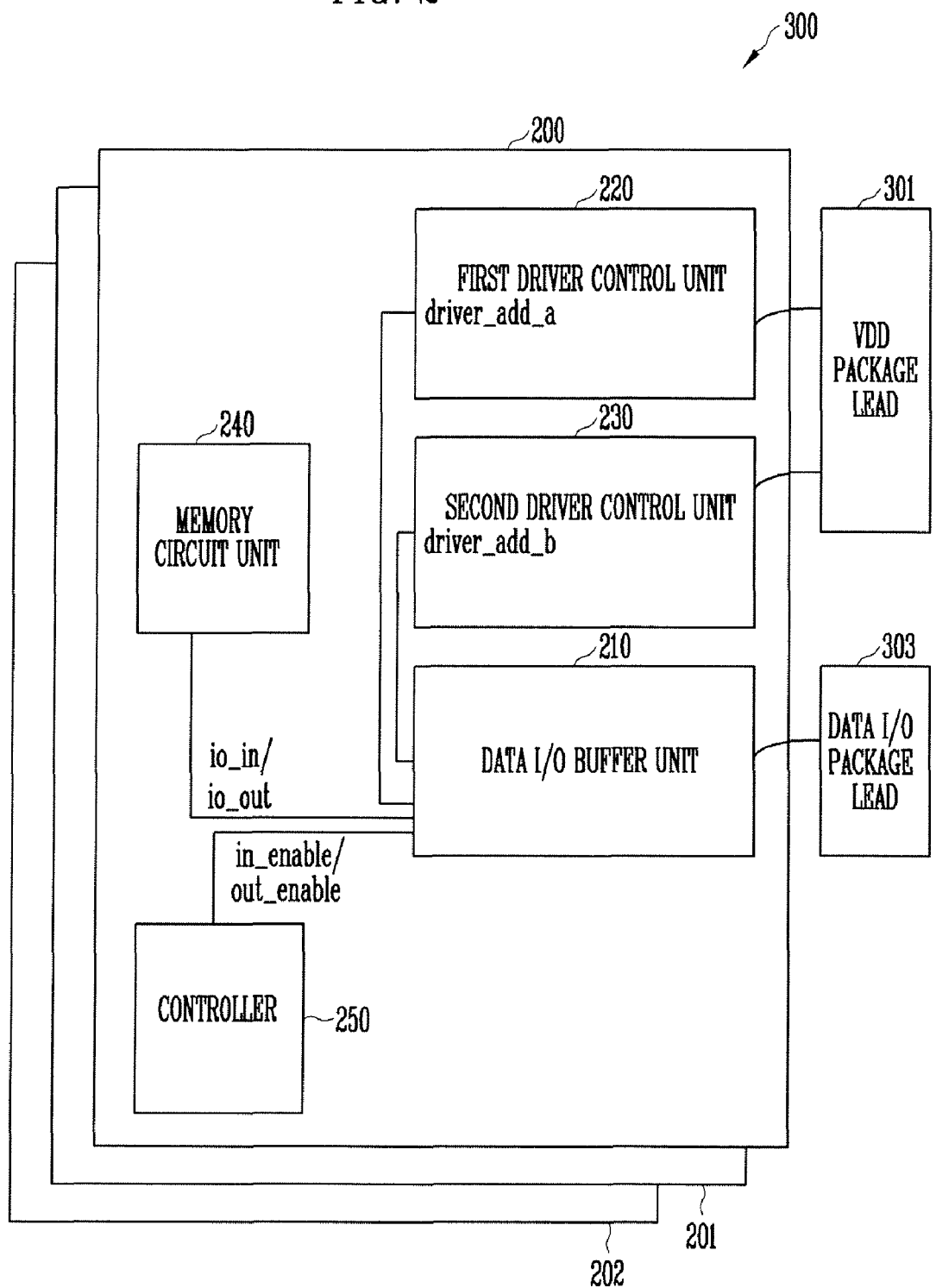
FIG. 2 is a block diagram of the I/O pad circuit of a memory chip package according to an embodiment of this disclosure.

FIG. 2 is a block diagram of the I/O pad circuit of a memory chip package according to an embodiment of this disclosure.

Referring to FIG. 2, the memory chip package 300 includes a plurality of memory chips 200, 201, 202. The memory chips 200, 201, 202 have the same construction, and so the memory chip 200 is described below as an example.

The memory chip 200 includes a data I/O buffer unit 210, first and second driver control units 220, 230, a memory circuit unit 240, and a controller 250.

The memory chips 200, 201, 202 are wired to a data I/O package lead 303 for inputting and outputting data. Thus, as the number of wired memory chips such as 200, 201, 202, etc. increase, the driver capability will decrease.

To increase the driver capability, the first and second driver control units 220, 230 are used in an embodiment of the present disclosure as shown in FIG. 2.

The first and second driver control units 220, 230 are coupled in a wiring process to a VDD package lead 301 to which a power supply voltage (VDD) is selectively supplied. The data I/O buffer unit 210 is coupled to the memory circuit unit 240 through I/O signal lines io_in, io_out. The I/O operation of the data I/O buffer unit 210 is controlled in response to I/O enable signals in_enable, out_enable generated by the controller 250 of the memory chip package 300.

The memory circuit unit 240 includes circuits for storing data. Although not shown in FIG. 2, the memory circuit unit 240 can include, for example, a memory cell array and a page buffer unit.

The controller 250 controls the operations of the memory circuit unit 240 and the data I/O buffer unit 210.

The memory circuit unit 240 is coupled to the data I/O buffer unit 210 and configured to input and output data to and from the data I/O buffer unit 210. Accordingly, the memory circuit unit 240 and the data I/O buffer unit 210 are coupled together by the I/O signal lines io_in, io_out.

The controller 250 controls the data I/O operation of the data I/O buffer unit 210 by inputting the I/O enable signals in_enable, out_enable thereto.

The data I/O buffer unit 210 includes a basic I/O driver and two I/O drivers. The two I/O drivers are operated in response to first and second driver addition signals driver_add_a, driver_add_b respectively generated by the first and second driver control units 220, 230.

The data I/O buffer unit 210 is coupled, for example in a wiring manner, to the data I/O package lead 303. Likewise, the memory chips 201, 202 are also wired to the data I/O package lead 303.

Figure 3A:
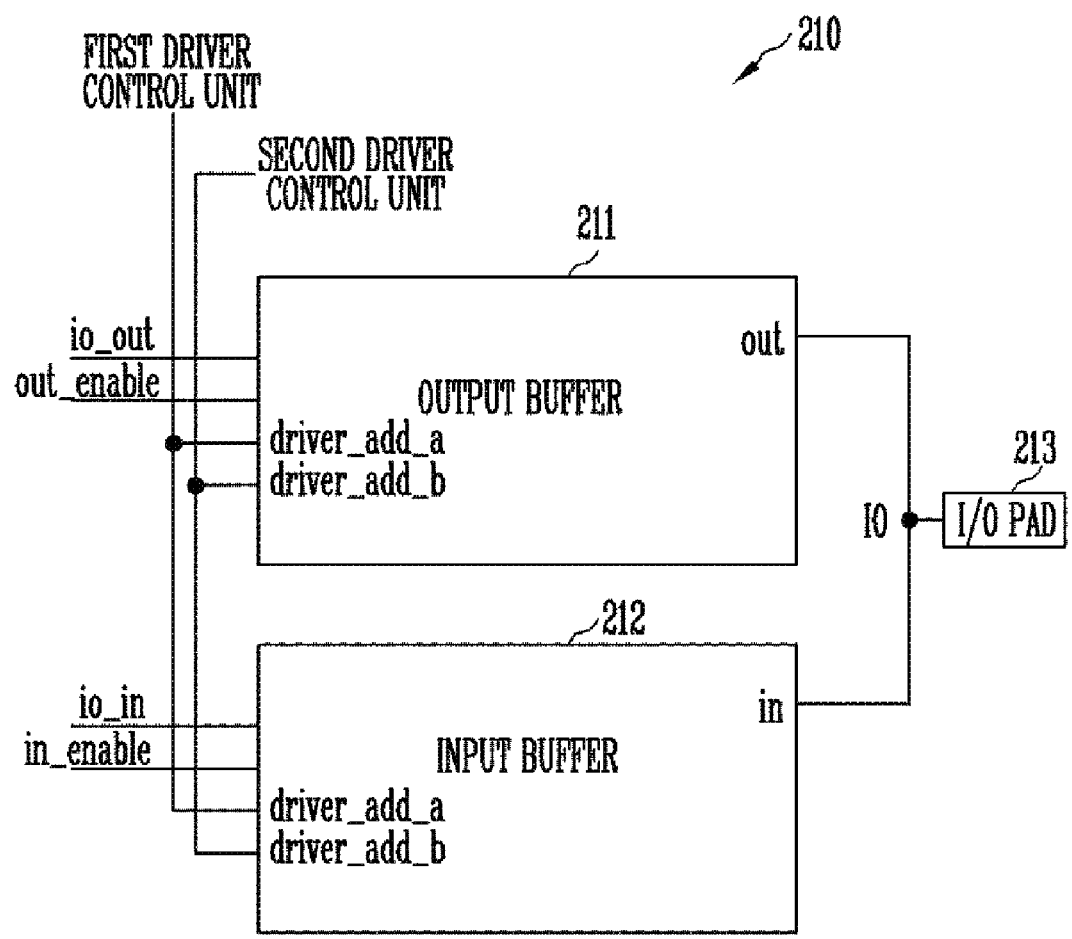
FIG. 3A is a detailed circuit diagram of a data I/O buffer unit shown in FIG. 2.

FIG. 3A is a detailed circuit diagram of the data I/O buffer unit 210 shown in FIG. 2.

Referring to FIG. 3A, the data I/O buffer unit 210 includes an output buffer 211, an input buffer 212, and an I/O pad 213.

Figure 3B:
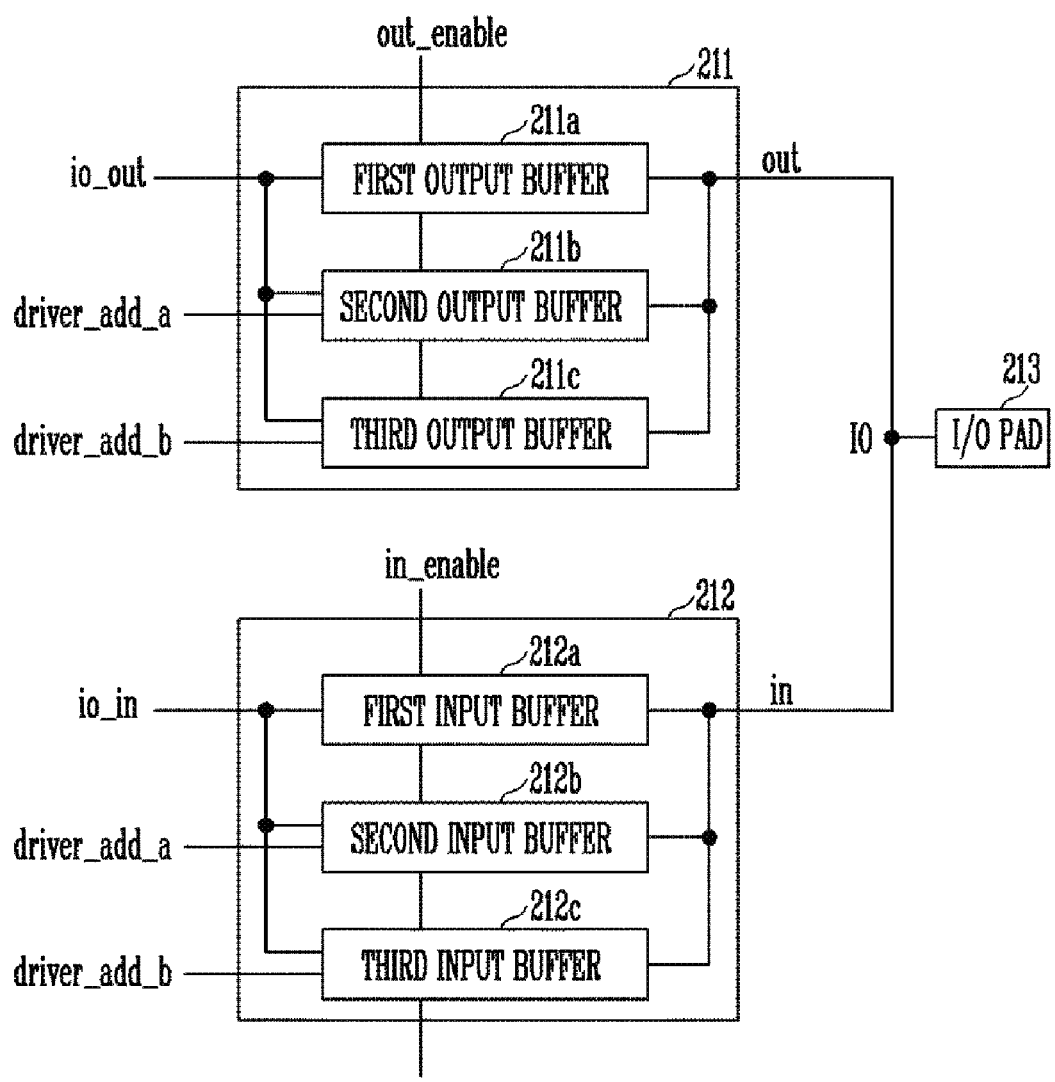
FIG. 3B is a detailed block diagram of an output buffer and an input buffer shown in FIG. 3A.

The output buffer 211 receives data from the memory circuit unit 240 through the input signal line io_out (see FIG. 3B) and outputs (out, as illustrated in FIGS. 3A and 3B) to the I/O pad 213 via an I/O node 10 in response to the output enable signal out_enable. The I/O pad 213 is wired to the data I/O package lead 303.

The input buffer 212 is enabled in response to the input enable signal in_enable and configured to output data received (in, as illustrated in FIGS. 3A and 3B) via the I/O node I/O to the memory circuit unit 240 through the input signal line io_in (see FIG. 3B).

Each of the output buffer 211 and the input buffer 212 according to an embodiment of this disclosure includes three buffers as shown in FIG. 3B.

FIG. 3B is a detailed block diagram of the output buffer 211 and the input buffer 212 shown in FIG. 3A.

Referring to FIG. 3B, the output buffer 211 includes first to third output buffers 211a, 211b, 211c. The input buffer 212 includes first to third input buffers 212a, 212b, 212c.

The first to third output buffers 211a, 211b, 211c and the first to third input buffers 212a, 212b, 212c are enabled in response to the I/O enable signals out_enable, in_enable, respectively. However, the second and third output buffers 212b, 212c and the second and third input buffers 212b, 212c start operating in response to the first and second driver addition signals driver_add_a, driver_add_b.

In an embodiment of this disclosure, the second and third output buffers 211b, 211c and the second and third input buffers 212b, 212c are further included in the output buffer 211 and the input buffer 212, respectively, as additional buffers, thereby constituting the first and second driver control units 220, 230. However, if the number of I/O buffers is increased, a driver control unit for outputting a driver addition signal is further required.

The operations of the second and third output buffers 211b, 211c and the second and third input buffers 212b, 212c can be set up in the wiring process as, for example, one of the final processes of fabricating the package.

The first and second driver addition signals driver_add_a, driver_add_b are generated by the first and second driver control units 220, 230, respectively.

Figure 4:
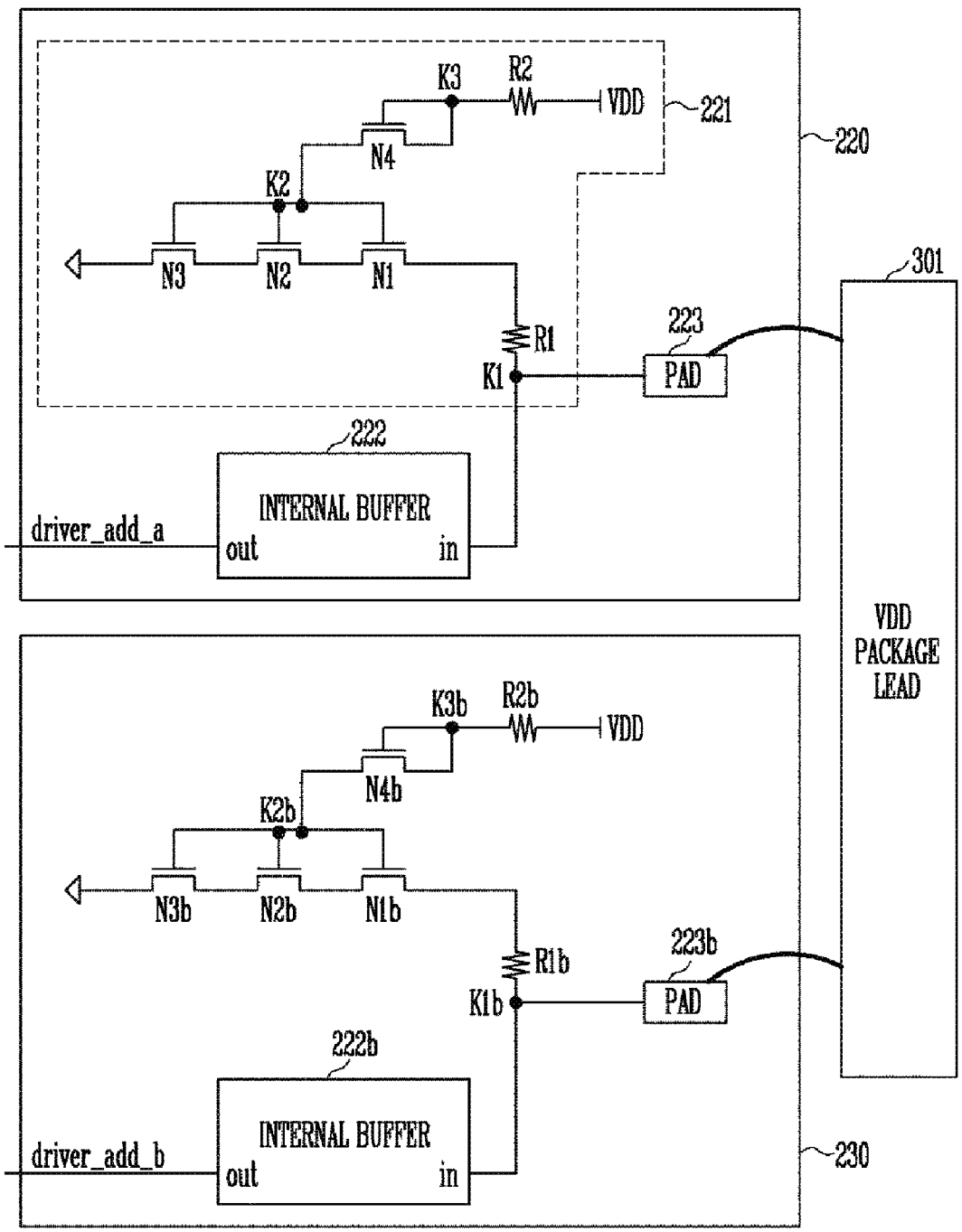
FIG. 4 is a detailed circuit diagram of first and second driver control units shown in FIG. 2.

FIG. 4 is a detailed circuit diagram of the first and second driver control units 220, 230 shown in FIG. 2

Referring to FIG. 4, the first and second driver control units 220, 230 have a similar construction in order to generate the first and second driver addition signals driver_add_a, driver_add_b, and so the first driver control unit 220 is described as an example (i.e., reference characters 222, 223, K1, K2, K3, N1, N2, N3, N4, R1, and R2, for element 220 correspond to reference characters 222b, 223b, K1b, K2b, K3b, N1b, N2b, N3b, N4b, R1b, and R2b for element 230, respectively).

The first driver control unit 220 includes a default setting unit 221, an internal buffer 222, and a pad 223.

The internal buffer 222 outputs the first driver addition signal driver_add_a through an output terminal out in response to the voltage level of a signal received through an input terminal in. The internal buffer 222 outputs the first driver addition signal driver_add_a of a low level in response to the signal of a low level and outputs the first driver addition signal driver_add_a of a high level in response to the signal of a high level. Here, for example, the signal of a low level has a voltage level close to 0 V, and the signal of a high level has a voltage level close to the power supply voltage (VDD) level.

When an initial operation is started, the default setting unit 221 inputs the signal of a low level to the input terminal in of the internal buffer 222 so that the internal buffer 222 outputs the first driver addition signal driver_add_a of a low level by default.

The node K1 of the default setting unit 221 is coupled to the pad 223. Here, the voltage level of a signal inputted to the input terminal in of the internal buffer 223 can shift depending on whether the pad 223 is coupled to the VDD package lead 301.

The default setting unit 221 includes first and second resistors R1, R2 and first to fourth NMOS transistors N1, N2, N3 N4.

The first to third NMOS transistors N1, N2, N3 and the first resistor R1 are coupled in series between the node K1 and the ground node.

The gates of the first to third NMOS transistors N1, N2, N3 are in common coupled to a node K2.

The fourth NMOS transistor N4 is coupled between the nodes K2 and K3. The gate of the fourth NMOS transistor N4 is coupled to the node K3. The second resistor R2 is coupled between the node K3 and the input terminal of the power supply voltage VDD.

When in the state where the node K1 is coupled to the pad 223 but the pad 223 is not coupled to the VDD package lead 301, the first to third NMOS transistors N1, N2, N3 would turn on when the fourth NMOS transistor N4 is turned on by the power supply voltage VDD. Accordingly, the node K1 is coupled to the ground node, and the signal of a low level is inputted to the input terminal in of the internal buffer 222.

The internal buffer 222 outputs the first driver addition signal driver_add_a of a low level in response to the signal of a low level.

Meanwhile, if the pad 223 is coupled to the VDD package lead 301, the power supply voltage VDD is supplied to the node K1. Accordingly, since the power supply voltage VDD is supplied to the node K1, the signal of a high level is supplied to the input terminal in of the internal buffer 222.

In response to the signal of a high level, the internal buffer 222 generates the first driver addition signal driver_add_a of a high level.

The above operation of the first driver control unit 220 is the same as that of the second driver control unit 230.

The first and second driver addition signals driver_add_a, driver_add_b are generated by the first and second driver control units 220, 230, respectively, such as that shown in FIG. 4. The driver capability of the data I/O buffer unit 210 is determined by the first and second driver addition signals driver_add_a, driver_add_b.

A process of selecting the driver capability of the data I/O buffer unit 210 is described below.

In a wiring process (i.e., one of the final processes of fabricating the memory chip package 300), a required driver capability of the data I/O buffer unit 210 can be set up by selectively wiring the first and second driver control units 220, 230 and the VDD package lead 301 depending on the number of memory chips.

As described above, in accordance with the memory chip package, redundant driver circuits for increasing the driver capability are included in the I/O pad circuit and are wired depending on a required driver capability. Accordingly, a required driver capability can be set up depending on the number of memory chips.

What is claimed is:

1. A memory chip, comprising:
a memory circuit unit configured to include memory cells for storing data;
a data input and output (I/O) buffer unit configured to include a plurality of data I/O buffer circuits, wherein one of the data I/O buffer circuits is operated by default in order to input and output data to and from the memory chip;
a plurality of driver control units, each of which is configured to generate a driver addition signal to enable corresponding one of the data I/O buffer circuits when a power supply voltage has been received; and a controller configured to generate I/O enable signals for controlling an operation of the data input and output I/O buffer unit.

2. The memory chip of claim 1, wherein the data input and output I/O buffer unit comprises:

an output buffer unit comprising a plurality of output buffer circuits, each enabled in response to an output enable signal received through an I/O node wired to an external data I/O package lead and configured to output the data received from the memory circuit unit to an I/O pad; and an input buffer unit coupled to the I/O pad and configured to include a plurality of input buffer circuits, each enabled in response to the input enable signal and configured to output data received from the I/O pad to the memory circuit unit.

3. The memory chip of claim 2, wherein each of the driver control units comprises:

a buffer comprising an input terminal and an output terminal, wherein the buffer is configured to determine a logic level of the driver addition signal corresponding to a voltage level of a signal received through the input terminal so as to determine an operation of a corresponding one of the data I/O buffer circuits, and wherein the buffer is configured to output the driver addition signal having a voltage having a logic level through the output terminal; and a default setting unit configured to couple the input terminal of the buffer to a ground node so that, in an initial operation, the driver addition signal is fixed to a first logic level, wherein in a case in which the input terminal is wired to the data I/O package lead, the driver addition signal is fixed to a second logic level irrespective of a connection of the default setting unit.

4. The memory chip of claim 3, wherein the default setting unit comprises:

a first transistor turned on by the power supply voltage; and a plurality of second transistors turned on by the power supply voltage received through the first transistor, wherein when the second transistors are turned on, the ground node and the input terminal of the buffer are coupled together.

5. The memory chip of claim 4, wherein the default setting unit further comprises:

a first resistor coupled between the first transistor and a terminal through which the power supply voltage is received; and a second resistor coupled between the second transistors and the input terminal of the buffer.

6. A memory chip package including one or more memory chips, each of the memory chips comprising:

a memory circuit unit configured to include memory cells for storing data;

a data I/O buffer unit configured to include a plurality of data I/O buffer circuits, wherein one of the data I/O buffer circuits is operated by default in order to input and output data to and from the memory chip;

a plurality of driver control units, each of which is configured to generate a driver addition signal to enable corresponding one of the data I/O buffer circuits when a power supply voltage has been received; and a controller configured to generate I/O enable signals for controlling an operation of the data I/O buffer unit.

7. The memory chip package of claim 6, wherein each of the driver control units comprises:

a buffer comprising an input terminal and an output terminal, wherein the buffer is configured to determine a logic level of the driver addition signal corresponding to a voltage level of a signal received through the input terminal so as to determine an operation of a corresponding one of the data I/O buffer circuits, and wherein the buffer is configured to output the driver addition signal having a voltage having a logic level through the output terminal; and a default setting unit configured to couple the input terminal of the buffer to a ground node so that, in an initial operation, the driver addition signal is fixed to a first logic level, wherein in a case in which the input terminal is wired to the data I/O package lead, the power supply voltage is supplied to the input terminal so that the driver addition signal is fixed to a second logic level irrespective of a connection of the default setting unit.

8. The memory chip package of claim 7, wherein the default setting unit comprises:

a first transistor turned on by the power supply voltage; and a plurality of second transistors turned on by the power supply voltage received through the first transistor, wherein when the second transistors are turned on, the ground node and the input terminal of the buffer are coupled together.

9. The memory chip package of claim 8, wherein the default setting unit further comprises:

a first resistor coupled between the first transistor and a terminal through which the power supply voltage is received; and a second resistor coupled between the second transistors and the input terminal of the buffer.

* * * * *